United States Patent [19]

Lee et al.

[11] Patent Number: 5,328,860

[45] Date of Patent: Jul. 12, 1994

[54] METHOD OF MANUFACTURING A SEMICONDUCTOR DEVICE

[75] Inventors: Yong J. Lee, Chungcheongnam-do; Duk M. Yi, Cheongju-city; Young O. Kim, Kyungki-do; Gyu C. Kim, Seoul, all of Rep. of Korea

[73] Assignee: Samsung Electronics Co., Ltd., Kyungki-do, Rep. of Korea

[21] Appl. No.: 46,282

[22] Filed: Apr. 15, 1993

Related U.S. Application Data

[62] Division of Ser. No. 880,212, May 8, 1992, Pat. No. 5,278,084.

[30] Foreign Application Priority Data

May 9, 1991 [KR] Rep. of Korea .................. 91-7496
Jul. 20, 1991 [KR] Rep. of Korea .................. 91-12536

[51] Int. Cl.$^5$ .......................................... H01L 21/265
[52] U.S. Cl. ........................................ 437/34; 437/44; 437/59; 437/228; 156/643
[58] Field of Search ................ 437/59, 34, 44, 228; 156/643, 650, 651

[56] References Cited

U.S. PATENT DOCUMENTS 4,690,728 9/1987 Tsang et al. ................ 437/918

FOREIGN PATENT DOCUMENTS 0089926 5/1985 Japan .

Primary Examiner—Tom Thomas
Assistant Examiner—Tuan Nguyen
Attorney, Agent, or Firm—Robert A. Westerlund; Stephen R. Whitt; Charles R. Donohoe

[57] ABSTRACT

A method for manufacturing BiCMOS semiconductor devices in which an oxide layer formed on the surface of a semiconductor substrate for the purpose of facilitating formation of spacers adjacent to sidewalls of the gates of the MOS transistors thereof is only partially removed, by using a dry etching process, to thereby leave a residual oxide layer, which is then removed, by using a wet etching process, to thereby form the spacers. Alternatively, all portions of the oxide layer except a portion thereof overlying the base-emitter region of the bipolar transistor of the BiCMOS device is removed, thereby precluding the necessity of etching the oxide layer away at the base-emitter junction. In either case, the DC forward current gain Hfe and linearity of the bipolar transistor of the BiCMOS device are enhanced.

5 Claims, 5 Drawing Sheets

METHOD OF MANUFACTURING A SEMICONDUCTOR DEVICE

This is a division of application Ser. No. 07/880,212, filed may 8, 1992, now U.S. Pat. No. 5,278,084.

BACKGROUND OF THE INVENTION

The present invention relates to a method of manufacturing a semiconductor device and, more particularly, to a method of integrating both bipolar and CMOS transistors on the same substrate.

The present trend towards miniaturization and increased operating speeds of electronic products, has necessitated the development of multi-functional semiconductor devices having both bipolar and CMOS transistors fabricated on a single semiconductor chip. This technology is commonly referred to as BiCMOS.

BiCMOS devices generally have a lightly doped drain (LDD) structure in order to prevent an undesirable drop in the breakdown voltage thereof due to injection of hot electrons generated by the NMOS transistors thereof. The LDD structure is generally obtained by the below-described process.

More particularly, after the gate electrodes of the PMOS and NMOS transistors are formed, an oxide layer of 2000–3000Å is formed by means of a chemical vapor deposition (CVD) technique, and then removed by means of a dry etching technique, such as reactive ion etching (RIE), until the surface of the semiconductor substrate is exposed, to thereby form spacers adjacent to the sidewalls of the gate electrodes. The regions beneath the spacers are protected from subsequent ion implantation which is carried out to form the drain regions. The regions beneath the spacers are lightly doped by diffusion, thereby increasing the breakdown voltages at the edge of the drain junctions.

The above-described process for forming LDD structures in BiCMOS devices suffers from the following drawbacks and shortcomings. More particularly, the step of dry etching to remove the oxide layer for forming the spacers produces damages such as dislocation on the surface of the substrate. Further, the degree of oxide removal is variable and non-uniform across the surface of the wafer in which the BiCMOS devices are formed, due to the inherent uniformity limitations of the dry etching equipment. These problems with dry etching render the base-emitter junctions in BiCMOS devices unstable, thereby degrading the reliability thereof, and further, causing non-linearity of the DC forward current gain Hfe of the bipolar transistors thereof.

As is evident from the foregoing, there presently exists a need for a method of manufacturing a BiCMOS device which overcomes the above-described drawbacks and shortcomings of the presently available BiCMOS manufacturing technology. The present invention fulfills this need.

SUMMARY OF THE INVENTION

The present invention encompasses, in a first preferred embodiment, a method for manufacturing a BiCMOS semiconductor device in which an oxide layer formed over the entire surface of a semiconductor substrate, for the purpose of facilitating the formation of spacers adjacent to sidewalls of the gates of the MOS transistors thereof, is only partially removed, by using a dry etching process, preferably a reactive ion etching process, to thereby leave a residual oxide layer. Then, the residual oxide layer is removed by using a wet etching process, to thereby form the spacers adjacent to the sidewalls of the gates. Alternatively, in a second preferred embodiment of the present invention, all portions of the oxide layer except a portion thereof overlying the base-emitter region of the bipolar transistor of the BiCMOS device is removed, thereby precluding the necessity of etching the oxide layer away at all at the base-emitter junction. In either case, with the method of the present invention, the prior art problems of damages, such as dislocation, and non-uniformity of oxide layer removal, are eliminated, thereby resulting in enhanced DC forward current gain Hfe and linearity for the bipolar transistor of the BiCMOS device.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION OF THE INVENTION

With reference now to FIGS. 1A to 1I, there can be seen a step-by-step illustration of a BiCMOS manufacturing process according to a first preferred embodiment of the instant invention. Although various specific process parameters and other details of implementation are set forth in the following description, it should be immediately recognized that the present invention is not limited thereto. Rather, the present invention, in its broadest aspect, resides in the basic methodology employed to manufacture a BiCMOS device, not the particular details of implementation thereof, as these details will vary according to the application and environment in which the method of the present invention is utilized, in a manner well-known to the those of ordinary skill in the semiconductor process art.

Figure 1A:
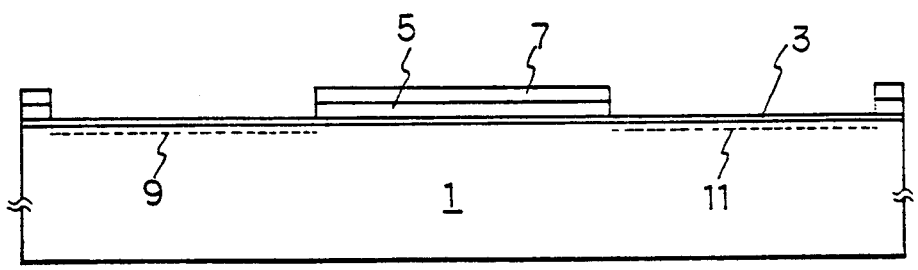
FIGS. 1A to 1I are cross-sectional views depicting successive manufacturing steps of the first preferred embodiment of the present invention; and, FIGS. 2A to 2E are cross-sectional views depicting successive manufacturing steps of a second preferred embodiment of the present invention.

Referring specifically now to FIG. 1A, after sequentially forming a first pad oxide layer 3, a first nitride layer 5, and a photoresist layer 7 on the entire surface of a P-type semiconductor substrate 1 having, e.g., a resistivity of 2–20$\Omega$.cm and an orientation of {100}, a predetermined part of the first pad oxide layer 3, is exposed, e.g., by a conventional photolithography process. Next, first and second ion implantation regions 9, 11 are formed as Nt buried layers on the exposed part of the first pad oxide layer 3 by the ion implantation of N-type impurities, such as arsenic with a dose of $1 \times 10^{15}$ ~$5 \times 10^{15}$ ion/cm$^2$ at an energy of about 100 KeV.

Figure 1B:
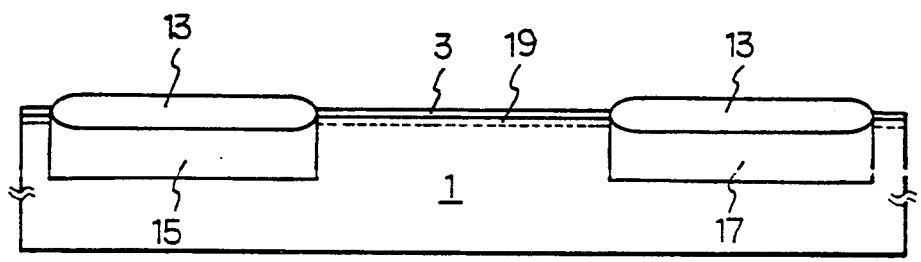

With reference to FIG. 1B, after removing the photoresist layer 7, a second oxide layer 13 is formed by thermal oxidation of the exposed part of the first pad oxide layer 3 by using the first nitride layer 5 as a mask. During thermal oxidation, the impurities in the first and second ion implantation regions 9, 11 are diffused and formed first and second N+ buried layers 15, 17, respectively. Then, after removing the nitride layer 5, a third ion implantation region 19 is formed by ion implantation of P-type impurities, such as boron with a dose of $1 \times 10^{--} \sim 5 \times 10^{13}$ ion/cm$^2$ at an energy of about 80 KeV, in order to form a P+ buried layer in the substrate 1 under the first pad oxide layer 3, by using the second oxide layer 13 as a mask.

Figure 1C:
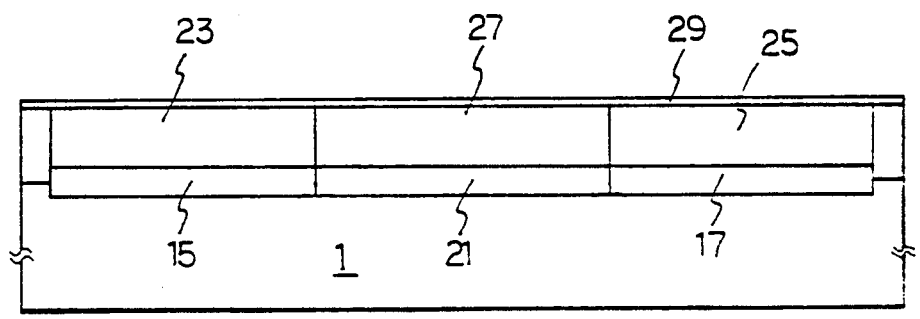

With reference to FIG. 1C, the impurities in the third ion implantation region 19 are diffused and form a third P+ buried layer 21. After removing the first and second oxide layers 3 and 13, an epitaxial layer 30 of, e.g., about 1.5 μm is formed. Subsequently, first, second, and third wells 23, 25, and 27 are formed. The first and second wells 23 and 25 are formed by ion implanting and thermal processing of N-type impurities, such as phosphorous with a dose of $1 \times 10^{12} \sim 3 \times 10^{12}$ ion/cm$^2$ at an energy of 180 KeV, and the third well 27 is formed by ion implantation of P-type impurities such as boron. Next, a third pad oxide layer 29 is formed on the surface of the first, second, and third wells 23, 25, and 27.

Figure 1D:
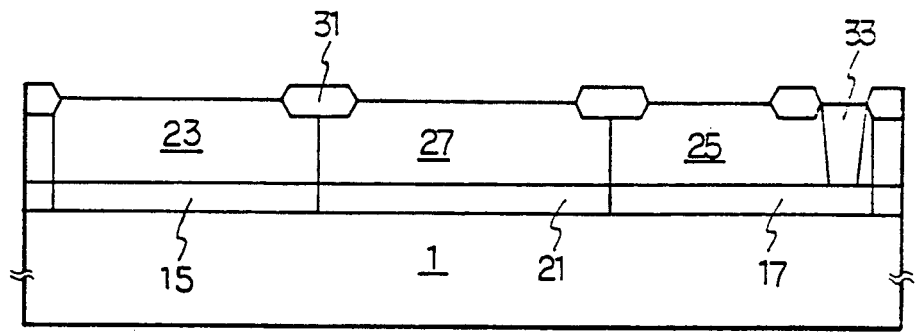

With reference to FIG. 1D, a field oxide layer 31 for isolating active regions is formed, e.g., by conventional local oxidation of silicon (LOCOS). Subsequently, N-type impurities such as phosphorous are implanted into a predetermined part of the second well 25, e.g., with a dose of $3 \times 10^{15} \sim 5 \times 10^{15}$ ion/cm$^2$ at an energy of about 100 KeV, followed by thermal processing, to form a collector region 33 of a bipolar transistor C and to remove the third pad oxide layer 29.

Figure 1E:
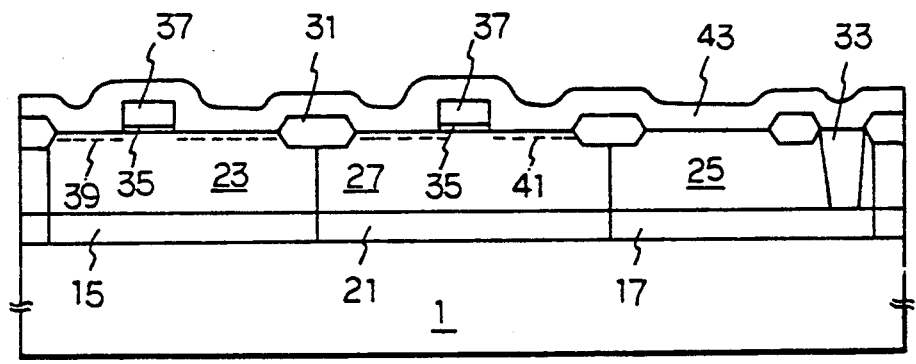

With reference to FIG. 1E, a gate oxide layer 35 of 200–500Å and gates 37 of 2000–3000Å are formed on predetermined parts of the first and third wells 23, and 27. The gates 37 are preferably formed of polycrystalline silicon, or metal silicide. Next, N-type impurities are ion-implanted in the first and third wells 23 and 27, e.g., with a dose of $1 \times 10^{13} \sim 5 \times 10^{13}$ ion/cm$^2$ at an energy of about 65 KeV. By using the gates 37 as a mask, fourth and fifth ion implantation regions 39 and 41 are formed for the LDD structure of MOS transistors A, B. Subsequently, an oxide layer 43 of 2000–3000Å is formed over the entire structure by a method such as chemical vapor deposition (CVD) or low temperature oxidation (LTO).

Figure 1F:
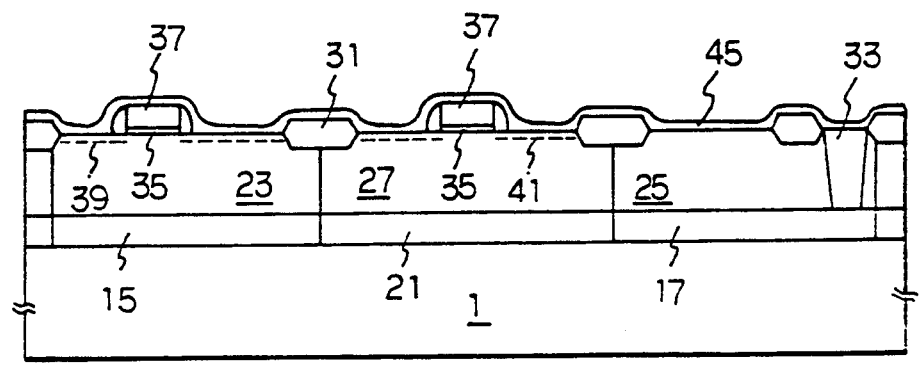

With reference to FIG. 1F, the oxide layer 43 is partially removed, e.g., by a dry etching method such as reactive ion etching (RIE), until only a thickness of 200–500Å thereof remains as a residual oxide layer 45. If the oxide layer 43 is completely removed by the dry etching method, as is done with current BiCMOS technology, damage such as dislocation is produced on the surfaces of the wells 23, 25, and 27.

Figure 1G:
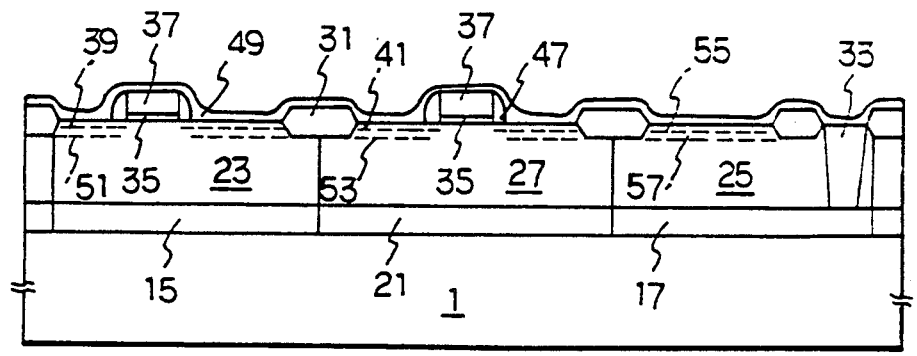

With reference to FIG. 1G, the residual oxide layer 45 is removed, e.g., by a conventional wet etching method, to expose the first, second, and third wells 23, 25, and 27. In this manner, spacers 47 are formed adjacent to the sidewalls of the gates 37. Since the residual oxide layer 45 is removed by a wet etching method, rather than by dry etching, no damage, such as dislocation, is caused to the surface of the wells 23, 25, and 27. Also, as the oxide layer 43 is removed by the dry etching method, such as RIE, except for the residual oxide layer 45, before the residual oxide layer 45 is removed by the wet etching method, the residual oxide layer 45 can be removed uniformly everywhere, independent of the position of the substrate 1 on the host wafer (not shown). Next, a first oxide interlayer 49 of 500–1500Å is formed on the surface of the entire structure, e.g., by conventional chemical vapor deposition (CVD) or low temperature oxide deposition (LTO), and sixth and seventh ion-implantation regions 51 and 53 are formed by ion-implantation of impurities such as BF$_2$ and arsenic into the first and third wells 23 and 27, respectively, e.g., with a dose of $3 \times 10^{15} \sim 5 \times 10^{15}$ ion/cm$^2$ at a proper energy, by using the gates 37 as a mask. During the forming of the sixth ion-implantation region 51, an eighth ion-implantation region 55, for the base region of a bipolar transistor C, is simultaneously formed in the second well 25. A ninth ion-implantation region 57 is formed in the second well 25 by the ion-implantation of P-type impurities, such as boron with a dose of $1 \times 10^{13} \sim 2 \times 10^{13}$ ion/cm$^2$ at an energy of about 80 KeV.

Figure 1H:
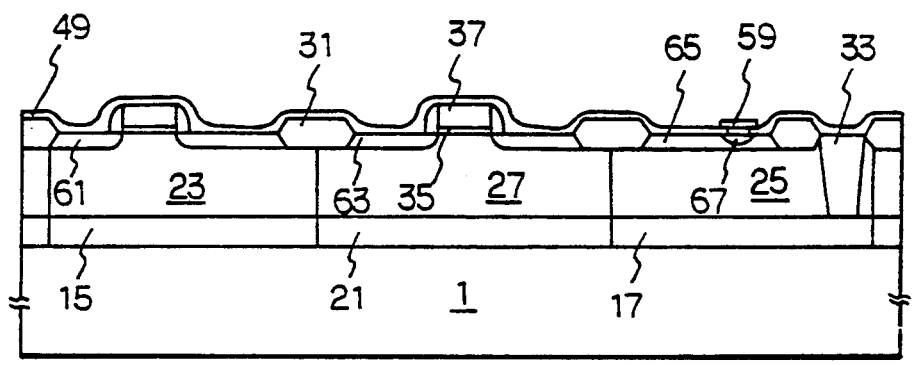

With reference to FIG. 1H, a predetermined part of the first oxide layer 49 where the emitter region of the bipolar transistor C is to be subsequently formed (as described below), is removed, e.g., by a conventional photolithography process. In this step, the predetermined part of the first oxide layer 49 is preferably removed by the RIE method, to expose the second well 25, and the exposed part of the second well 25 is again dry-etched, e.g., by a plasma method. In this manner, damage such as dislocation from the surface of the second well 25 which is exposed during the removal of the first oxide layer 49 by the reactive ion etching (RIE) step, can be removed by the subsequent plasma dry etching step. Next, after a polycrystalline silicon layer (of which only a post-etching portion 59 is shown) is deposited on the first oxide layer 49, N-type impurities such as arsenic, for an emitter source, are ion-implanted into the entire surface thereof, e.g., with a dose of $5 \times 10^{15} \sim 8 \times 10^{15}$ ion/cm$^2$. An emitter contact region 59 is formed by patterning the polycrystalline silicon layer, and then, source and drain regions 61 of a PMOS transistor A, source and drain regions 63 of an NMOS transistor B, and a base region of a bipolar transistor C are formed by diffusion. In this step, the N-type impurities doped in the emitter contact region 59, such as arsenic, are diffused into a predetermined portion of the base region 66 to thereby form an emitter region 67. Thus, the base-emitter junction of the emitter region 67 in the base region 65 are stably formed, thereby improving the DC forward current gain characteristics Hfe of the resultant bipolar transistor C.

Figure 1I:
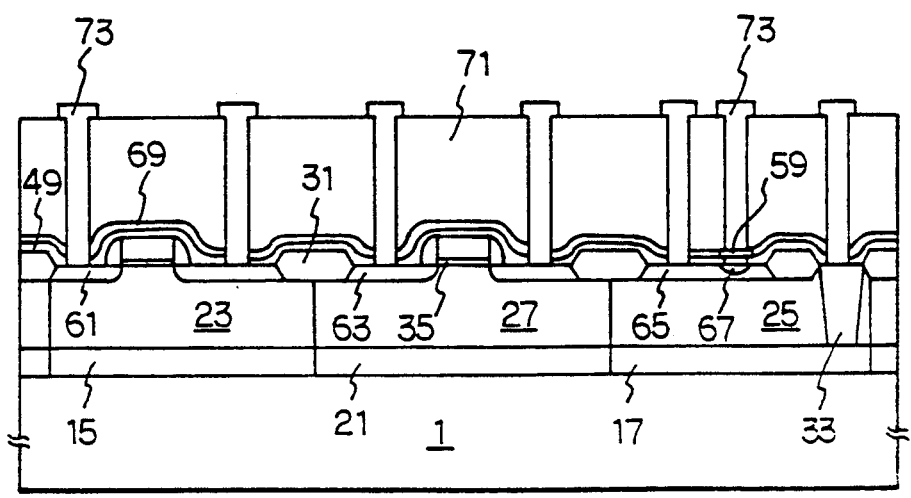

With reference to FIG. 1I, a second oxide layer 69 is formed over the entire structure, e.g., by a chemical vapor deposition (CVD) or high temperature oxide deposition method (HTO). Subsequently, a passivation layer 71 is formed by depositing phospho-silicate glass (PSG) or borophospho-silicate glass (BPSG) over the entire surface of the second oxide layer 69, and contact holes 70 are formed, e.g., by a conventional photolithography process. Finally, a metal conductivity layer 73 is formed through the contact holes 70, to complete the BiCMOS device D1.

With reference now to FIGS. 2A–2E, there can be seen a step-by-step illustration of a BiCMOS manufacturing process according to a second preferred embodiment of the present invention. It should be appreciated that the prefatory statements made hereinabove in connection with the first preferred embodiment depicted in FIGS. 1A–1I apply equally with respect to the second preferred embodiment depicted in FIGS. 2A–2E.

In order to avoid duplicative disclosure, the description of the method of the second preferred embodiment of the present invention will begin with the step (depicted in FIG. 2A) corresponding to the step in the method of the first preferred embodiment of the present invention depicted in FIG. 1E, since all preceding steps may suitably be carried out in the same manner as described previously in connection with the first preferred embodiment, as illustrated in FIGS. 1A-1D.

Figure 2A:
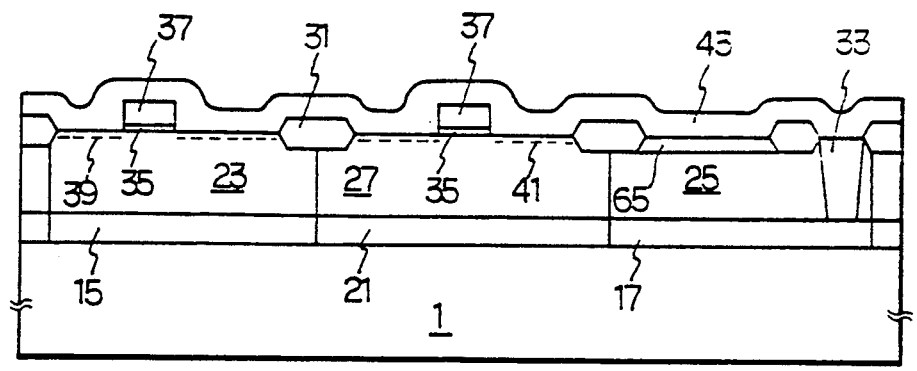

Referring specifically now to FIG. 2A, a gate oxide layer 35 of 200-500Å and gates 37 of 2000-3000Å are sequentially formed on predetermined parts of the first and third wells 23 and 27. The gates 37 are formed of polycrystalline silicon or metal silicide. Next, fourth and fifth ion implantation regions 39 and 41 are formed by ion implantation of P-type and N-type impurities, such as boron and phosphorous, respectively, into the first and third wells 23 and 27, e.g., with a dose of $1 \times 10^{13} \sim 5 \times 10^{13}$ ion/cm$^2$ at a proper energy, by using gates 37 as a mask, in order to form the lightly doped drain structure of the MOS transistors A and B. Subsequently, base region 65 of the bipolar transistor is formed in the surface of the second well 25, which is formed by ion-implantation of P-type impurities, such as boron, e.g., with a dose of $1 \times 10^{13} \sim 2 \times 10^{13}$ ion/cm$^2$ at an energy of 80 KeV. Then, an oxide layer 43 of 2000-3000Å is formed over the entire structure by a chemical vapor deposition (CVD) or low temperature oxidation method (LTO).

Figure 2B:
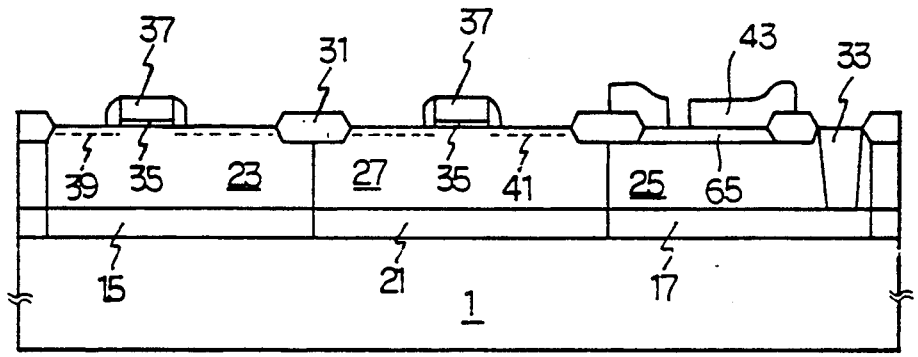

With reference to FIG. 2B, the oxide layer 43, except for the portion thereof disposed above the base region 65, is removed, e.g., by a conventional photolithography process. Next, a portion of the oxide layer 43 corresponding to the extrinsic base region of the bipolar transistor C is removed, e.g., by a reactive ion etching method, such as RIE or the like. During this step, spacers 47 are formed adjacent to the sidewalls of the gates 37.

Figure 2C:
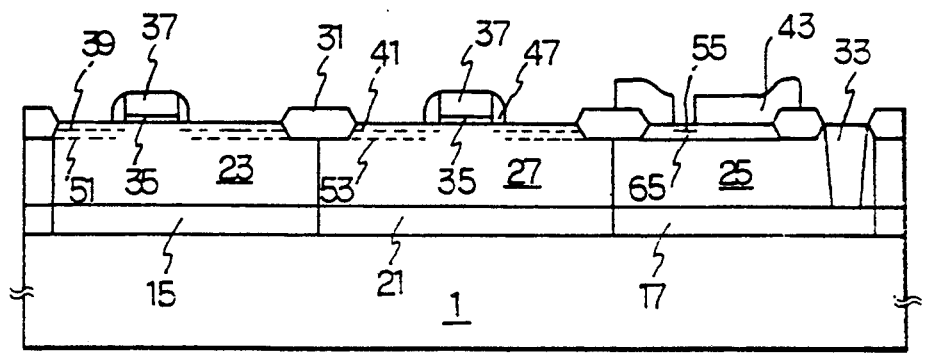

With reference to FIG. 2C, sixth and seventh ion-implantation regions 51 and 53 are formed by ion-implantation of P-type impurities, such BF$_2$, and N-type impurities, such as phosphorous, into the first and third wells 23 and 27, e.g., with a dose of $3 \times 10^{15} \sim 5 \times 10^{15}$ ion/cm$^2$ at a proper energy, by using the gates 37 as a mask. While forming the sixth ion-implantation region 51, an eighth ion-implantation region 55, for forming the extrinsic base region of a bipolar transistor C, is formed in the exposed part of the base region 65, in order to reduce the contact resistance with the metals formed thereafter.

Figure 2D:
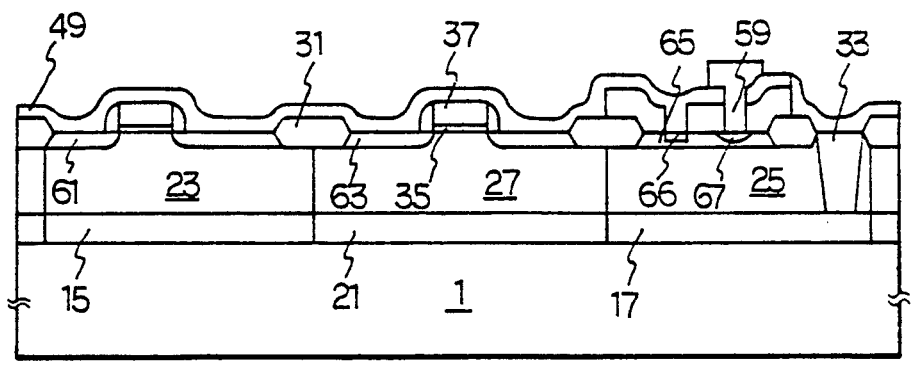

With reference to FIG. 2D, after a first oxide layer 49 of 500-1500Å is deposited, the predetermined part of the emitter region of the bipolar transistor C is exposed, e.g., by a conventional photolithography process. Then, after a polycrystalline silicon layer (of which only a post-etching portion 59 is shown) is deposited on the surface of the first oxide layer 49, N-type impurities such as arsenic are ion-implanted into the entire surface thereof, in order to form the impurities source for the emitter of the bipolar transistor C. After an emitter contact region 59 is formed by patterning the polycrystalline silicon layer, the source and drain region 61 of the PMOS transistor A, the source and drain region 63 of the NMOS transistor B, and the extrinsic base region 66 of the bipolar transistor C are formed by diffusion.

Next, N-impurities coated at the emitter contact region 59 are diffused to form an extrinsic emitter region 67.

Figure 2E:
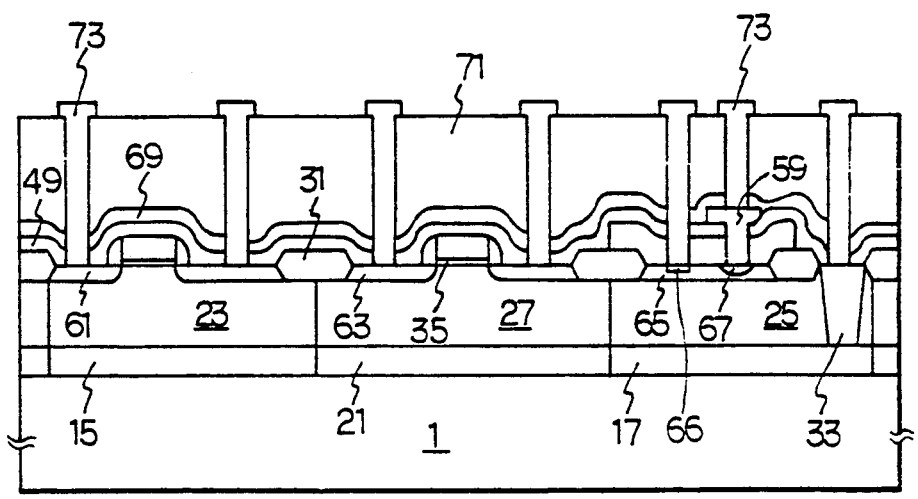

With reference to FIG. 2E, a second oxide layer 69 and a passivation layer 71 are formed by coating the entire structure with phospho-silicate glass (PSG) or borophospho-silicate glass (BPSG). Finally, after contact holes 70 are formed, e.g., by a conventional photolithography process, a metal conductivity layer 73 is formed, to thereby complete the BiCMOS device D2.

It can now be appreciated that the BiCMOS device manufacturing method of both the first and second preferred embodiments of the present invention provides several important advantages over presently available BiCMOS technology. More particularly, the spacers 47 adjacent to the sidewalls of the gates 37 of the MOS transistors A and B are formed by a two-step oxide layer etching technique which ensures uniform removal of the oxide layer 43 and prevents damage, such as dislocation, to the base-emitter junction of the bipolar transistor C.

Although two preferred embodiments of the present invention have been described in detail, it should be clearly understood that many variations and/or modifications of the basic inventive concepts herein taught which may appear to those skilled in the pertinent art will fall within the spirit and scope of the present invention, as defined in the appended claims.

What is claimed is:

1. A method for forming spacers adjacent to sidewalls of a gate electrode of a first MOS transistor formed in a semiconductor well region of a first conductivity type formed in a semiconductor substrate of a second conductivity type, comprising the steps of:

forming an oxide layer over said gate and said semiconductor well region;

partially removing said oxide layer by using a dry etching process, to thereby leave a residual oxide layer over said gate and said semiconductor well region; and, removing said residual oxide layer by using a wet etching process, to thereby form spacers adjacent to said sidewalls of said gate.

2. The method as set forth in claim 1, wherein said semiconductor substrate further includes a bipolar transistor and a second MOS transistor having a conductivity type opposite that of said first MOS transistor formed therein, to thereby provide a BiCMOS device.

3. The method as set forth in claim 1, wherein said dry etching process comprises a reactive ion etching process.

4. The method as set forth in claim 1, wherein said oxide layer has a thickness of approximately 2000-3000 angstroms.

5. The method as set forth in claim 4, wherein said residual oxide layer has a thickness of approximately 200-500 angstroms.

* * * * *